US012283038B2

(12) United States Patent
Nishikawa et al.

(10) Patent No.: US 12,283,038 B2
(45) Date of Patent: Apr. 22, 2025

(54) TOOL WEAR MONITORING DEVICE, TOOL WEAR MONITORING SYSTEM, AND PROGRAM

(71) Applicant: Hitachi, Ltd., Tokyo (JP)

(72) Inventors: Kenji Nishikawa, Tokyo (JP); Yasushi Sano, Tokyo (JP); Ippei Kono, Tokyo (JP)

(73) Assignee: Hitachi, Ltd., Tokyo (JP)

(*) Notice: Subject to any disclaimer, the term of this patent is extended or adjusted under 35 U.S.C. 154(b) by 365 days.

(21) Appl. No.: 17/840,900

(22) Filed: Jun. 15, 2022

(65) Prior Publication Data

US 2023/0008435 A1   Jan. 12, 2023

(30) Foreign Application Priority Data

Jul. 8, 2021   (JP) .................... 2021-113704

(51) Int. Cl.
| | | |
|---|---|---|
| *G01B 11/24* | (2006.01) | |
| *G01R 19/25* | (2006.01) | |
| *G02B 21/36* | (2006.01) | |
| *G06T 7/00* | (2017.01) | |
| *G06T 7/62* | (2017.01) | |

(Continued)

(52) U.S. Cl.
CPC ............ *G06T 7/0004* (2013.01); *G01B 11/24* (2013.01); *G01R 19/25* (2013.01); *G02B 21/36* (2013.01); *G06T 7/62* (2017.01); *G06T 7/97* (2017.01); *H04N 7/181* (2013.01); *H04N 7/183* (2013.01); *H04N 23/695* (2023.01); *H04N 23/90* (2023.01); *G01N 21/8851* (2013.01); *G06T 2207/10056* (2013.01); *G06T 2207/30164* (2013.01)

(58) Field of Classification Search
CPC .. G01N 21/885; G01B 11/24; G05B 19/4065; B23Q 17/249; B23Q 17/09; G06T 7/004; G06T 7/0004; G06T 7/60; G06T 2207/30164
See application file for complete search history.

(56) References Cited

U.S. PATENT DOCUMENTS

| | | | | |
|---|---|---|---|---|
| 4,700,224 | A | * 10/1987 | Miyasaka | ............... G01N 3/56 382/152 |
| 4,845,763 | A | * 7/1989 | Bandyopadhyay | .... G01B 11/24 382/152 |
| 2021/0294297 | A1* | 9/2021 | Maushart | ........... B23Q 17/2457 |

FOREIGN PATENT DOCUMENTS

| | | |
|---|---|---|
| JP | 9-57583 A | 3/1997 |
| JP | 10-34496 A | 2/1998 |

(Continued)

OTHER PUBLICATIONS

Japanese-language Office Action issued in Japanese Application No. 2021-113704 dated Jun. 11, 2024 with English translation (7 pages).

*Primary Examiner* — Jennifer Bahls

(74) *Attorney, Agent, or Firm* — Crowell & Moring LLP

(57) ABSTRACT

Provided is a tool wear monitoring device configured to input a plurality of pieces of image data captured with a microscope camera while changing an angle, and to monitor tool wear. The tool wear monitoring device includes a data analysis unit configured to analyze image data. The data analysis unit binarizes the plurality of pieces of image data captured while changing an angle, extracts data in which a worn region has a maximum area among the plurality of pieces of image data, and analyzes the amount of wear from the extracted data with the maximum area.

14 Claims, 11 Drawing Sheets

(51) Int. Cl.
*H04N 7/18* (2006.01)
*H04N 23/695* (2023.01)
*H04N 23/90* (2023.01)
*G01N 21/88* (2006.01)

(56) References Cited

FOREIGN PATENT DOCUMENTS

| | | |
|---|---|---|
| JP | 10-96616 A | 4/1998 |
| JP | 2002-337041 A | 11/2002 |
| JP | 2020-104257 A | 7/2020 |
| JP | 2021-53772 A | 4/2021 |

\* cited by examiner

F I G. 7
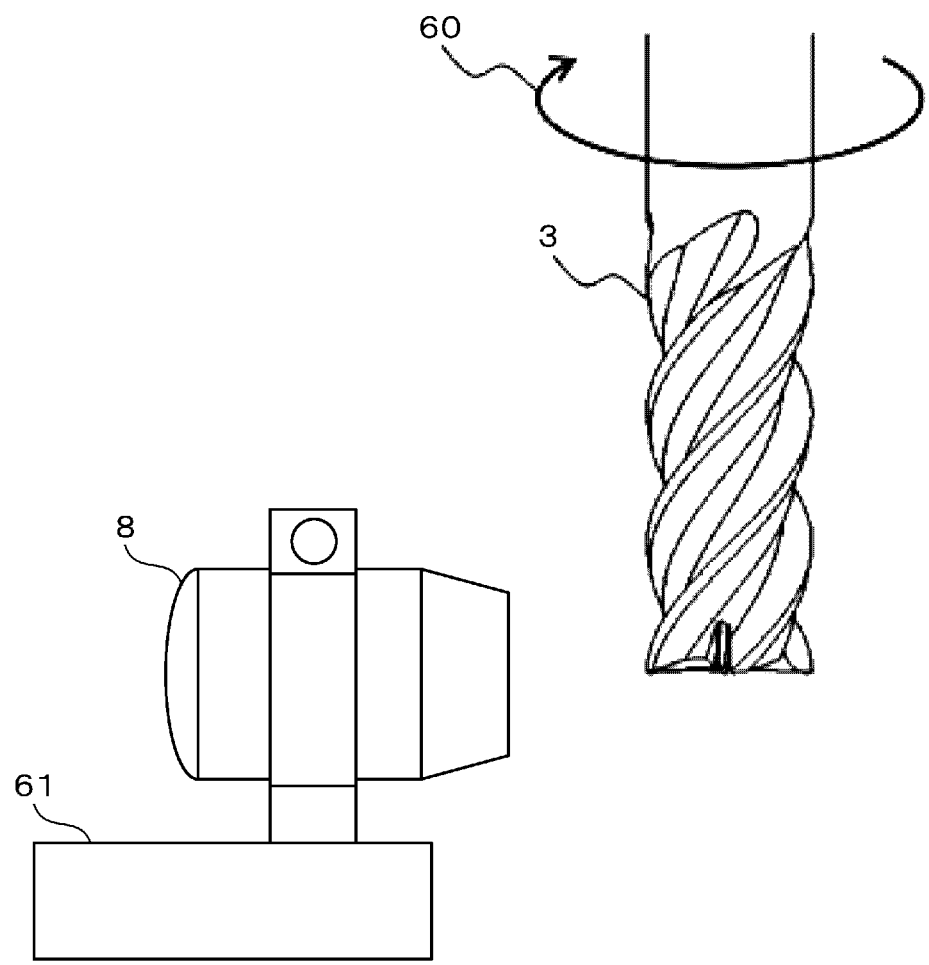

F I G. 8
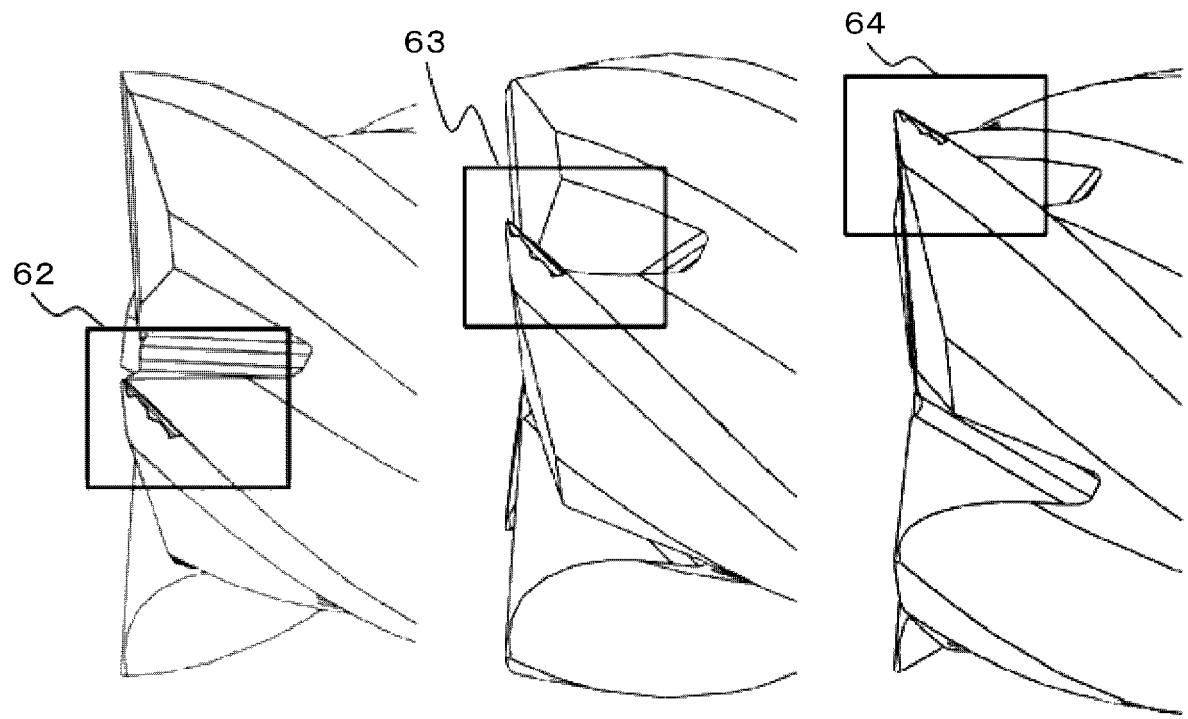
F I G. 9
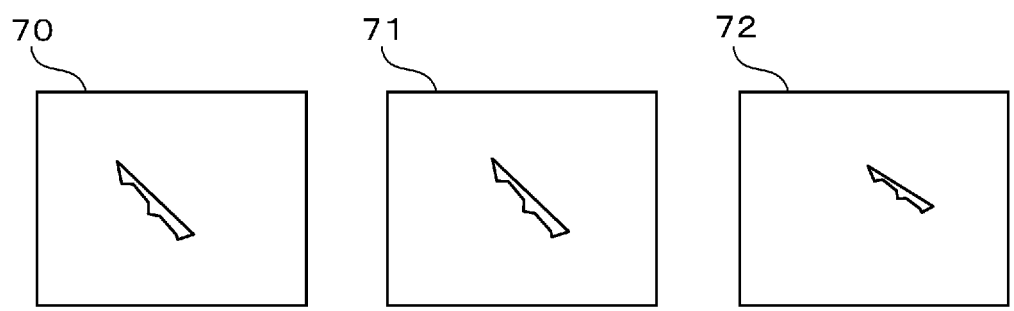

F I G. 1 2
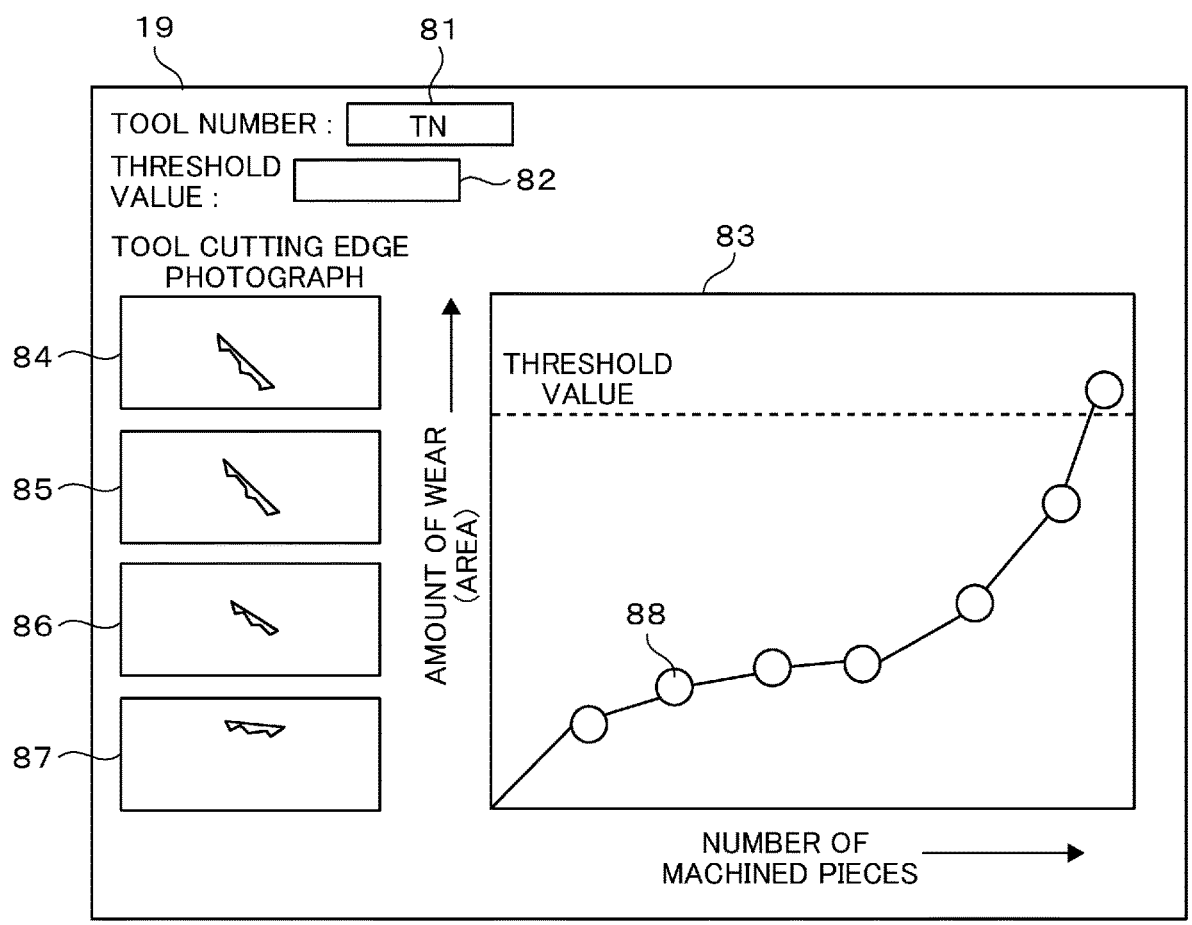

TOOL WEAR MONITORING DEVICE, TOOL WEAR MONITORING SYSTEM, AND PROGRAM

BACKGROUND OF THE INVENTION

1. Field of the Invention

The present invention relates to a monitoring technology of monitoring tool wear.

2. Description of the Related Art

A device that monitors a cutting tool by using a camera is described in JP H9-57583 A. The publication discloses "the whole or almost the whole of a tool after cutting is imaged with an infrared camera, a cutting edge position of the tool is recognized from a temperature distribution on a tool surface which can be identified from imaging data obtained with the infrared camera, a high-imaging-magnification television camera is moved to a position facing a tool cutting edge on the basis of information of the cutting edge position, the tool cutting edge is imaged with the television camera, and the amount of tool wear is measured from tool cutting edge imaging data obtained with the television camera" (refer to abstract).

Important tasks for an operator who operates a machine tool are finding of machining abnormality and replacement of a cutting tool. The machining abnormality is determined basically from vibration sound during machining or a load meter value that is a control current level of a motor. In addition, when abnormality occurs, a damage to the tool increases, and this leads to wear or breakage of the tool cutting edge. It is necessary to replace an abraded or broken tool with a new tool. Breakage can be clearly confirmed through visual observation, and can be easily noticed. On the other hand, there is a case where it is difficult to determine tool wear through visual observation. Accordingly, observation is basically made with a microscope, and when exceeding a constant tool wear width, replacement is performed. When the tool wear progresses, cutting quality deteriorates, a load during machining increases, a machining surface deteriorates, dimension accuracy of a target to be machined deteriorates, and the tool is chipped or broken. Particularly, in a case of machining a part of a large object that is expensive and does not tolerate failure, it is assumed that the tool may be broken during machining and the part may be scratched to a level that cannot be recovered. According to this, it is necessary to properly organize a variation in tool wear, and to monitor a tool wear state.

JP H9-57583 A discloses an amount-of-tool-wear automatic measuring device in which the whole or almost the whole of a tool after cutting is imaged with an infrared camera, a cutting edge position of the tool is recognized from a temperature distribution on a tool surface, a high-imaging-magnification television camera is moved to a position facing a tool cutting edge on the basis of information of the recognized cutting edge position, the tool cutting edge is imaged with the television camera, and the amount of tool wear is measured from tool cutting edge imaging data obtained with the television camera. However, the device described in JP H9-57583 A is configured to measure the amount of tool wear from the position that faces the tool cutting edge, and does not consider appropriate measurement of wear on a side portion of the tool.

SUMMARY OF THE INVENTION

Therefore, an object of the invention is to appropriately measure wear of a side surface and the like of a tool by imaging a cutting edge state of a tool after cutting while changing an angle and by analyzing acquired image data through image processing.

To solve the above-described problem, for example, configurations described in the appended claims are employed.

The present application includes a plurality of means for solving the problem, but as an example thereof, there is provided a tool wear monitoring device configured to input a plurality of pieces of image data captured with a microscope camera while changing an angle, and to monitor tool wear. The tool wear monitoring device includes a data analysis unit configured to analyze image data. The data analysis unit binarizes the plurality of pieces of image data captured while changing an angle, extracts data in which a worn region has a maximum area among the plurality of pieces of image data, and analyzes the amount of wear from the extracted data with the maximum area.

According to the invention, a cutting edge state of the tool after cutting is imaged while changing an angle, and acquired image data is analyzed through image processing. Accordingly, wear of a side surface and the like of the tool can be appropriately measured.

Objects, configurations, and effects other than those described above become clear from the following description of an embodiment.

BRIEF DESCRIPTION OF THE DRAWINGS

FIG. 7 is a view illustrating a configuration when capturing an image with a microscope camera;

FIG. 8 is a view illustrating an image at the time of imaging tool wear;

FIG. 9 is a view illustrating image processing for acquired image data;

FIG. 12 is a view illustrating an example of a GUI of a tool wear monitoring system of Example 3.

DETAILED DESCRIPTION OF THE PREFERRED EMBODIMENTS

Figure 1:
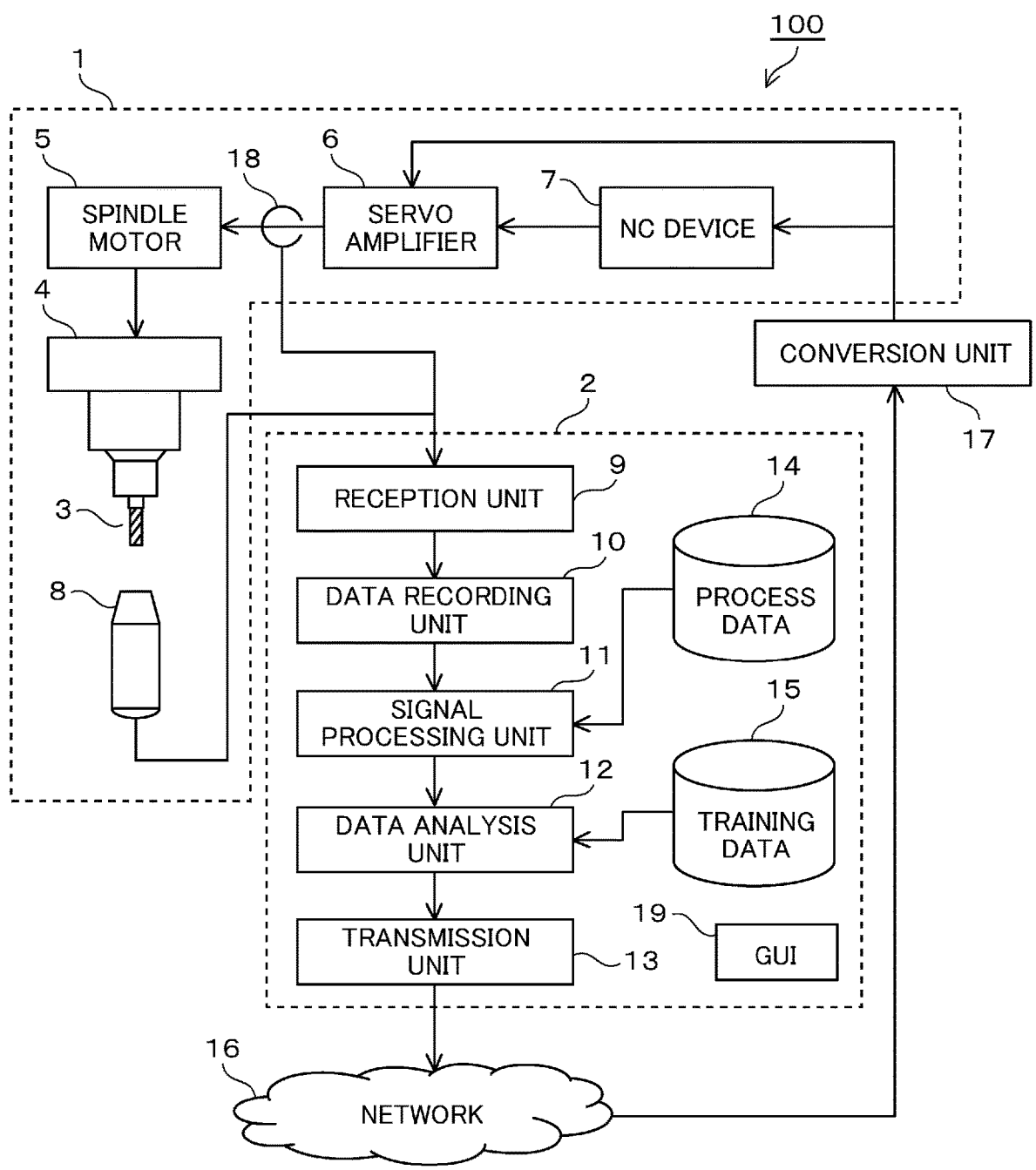
FIG. 1 is a view illustrating a configuration example of a tool wear monitoring system of Example 1.

Hereinafter, examples of the invention will be described with reference to the accompanying drawings. However, it should be understood that the invention is not intended to be analyzed with limitation to the following described contents of examples. It should be easily understood by those skilled in the art that specific configurations can be modified within a range not departing from the sprit and the gist of the invention. In addition, in the following configurations of the invention, the same reference numeral will be commonly used for the same portion or a portion having a similar function in the drawings, and redundant description thereof may be omitted.

Example 1

In this example, an example of a tool wear monitoring system will be described.

FIG. 1 is a view illustrating an example of a configuration diagram of the tool wear monitoring system. A tool wear monitoring system 100 includes a machine tool 1 and a tool wear monitoring device 2. The tool wear monitoring system 100 is used in a cutting process. In the cutting, a main shaft 4 to which a cutting tool 3 such as an end mill is fixed is rotated at a high speed to shape a workpiece to a desired shape. The machine tool 1 includes the cutting tool 3, the main shaft 4, a spindle motor 5 for rotating the main shaft 4, a servo amplifier 6 that inputs control current and voltage for driving the spindle motor 5, a numerical control device (NC device) 7 for movement in accordance with a command value, and the like.

In the tool wear monitoring system of the invention, a microscope camera 8 is provided in the machine tool. The microscope camera 8 may be provided in the same equipment as a site where the workpiece is fixed, or may be provided in a tool magazine in which unused tools are kept. In addition, connection may be established in a wired manner or in a wireless manner such as WiFi (registered trademark) and Bluetooth (registered trademark). In addition, a current and voltage sensor 18 that measures a current value and a voltage value of the spindle motor 5 is also provided.

Image data of the camera 8 and current and voltage values of the current and voltage sensor 18 are input to a reception unit 9 of the monitoring device 2. When data is received by the reception unit 9, the data is input to a signal processing unit through a data recording unit 10. In a case where the recorded data is in a raw data state, a lot of noise may be included. For example, in the current and voltage sensor 18, electrical noise may be introduced depending on a state in a field or a state in a control panel of a machining device. In addition, contrast may vary in image data in accordance with indoor brightness due to the weather. Therefore, it is important to remove noise through signal processing and to extract only current and voltage values used in machining, and this is a necessary element for monitoring with high accuracy. Note that, since necessary signal processing exists depending on a process, process data 14 associated with the signal processing is input here.

Data from which noise is removed is input to a data analysis unit 12. Here, the image data is subjected to image processing to analyze the amount of wear. In addition, current and voltage signals are used as is or converted into power and are converted into parameters corresponding to a load during machining. Training data 15 stores data accumulated in the past. The training data 15 may be utilized as teaching data in analysis by the data analysis unit 12. An analysis result in the data analysis unit 12 is input to a transmission unit 13. Here, the analysis result is transmitted to a network 16.

The network 16 is shared by a plurality of parties, and may be a cloud or an in-office server. For example, an image processing result is input through the network 16, and when machining stoppage is determined, the result is transmitted to a conversion unit 17 and is converted into a signal for controlling an NC device, and is fed back to the machine tool 1. At this time, control may be made through the NC device 7, or a signal may be directly given to the servo amplifier 6. In addition, the tool wear monitoring device 2 is provided with a graphical user interface (GUI) 19 that displays an analysis result or the like, or inputs a command.

Figure 2:
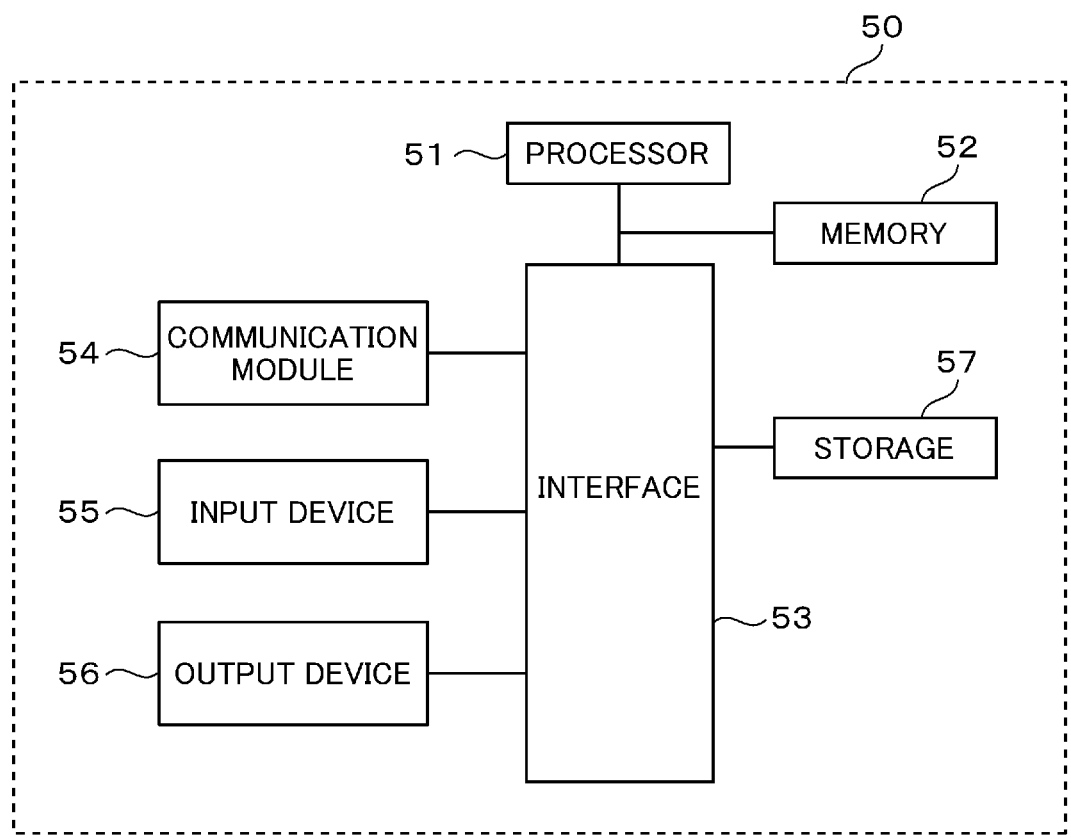
FIG. 2 is a view illustrating a configuration example of a computer that realizes the tool wear monitoring device.

FIG. 2 is a view illustrating a configuration example of a computer that realizes the tool wear monitoring device 2. The tool wear monitoring device 2 is constituted by a general computer 50 such as a pc including a processor 51 such as a central processing unit (CPU), a memory 52 such as a dynamic random access memory (DRAM), a storage 57 such as a hard disk drive (HDD) and a solid state drive (SSD), an input device 55 such as a keyboard, a mouse, and a touch panel, an output device 56 such as a display, a communication module 54 such as a network interface card (NIC), and an interface 53 that connects the above-described components. The computer may be configured on a cloud.

Figure 3:
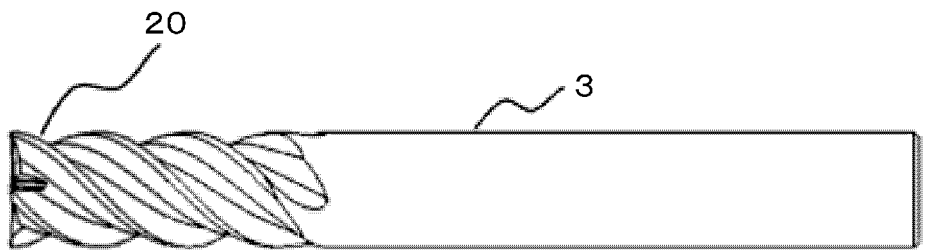
FIG. 3 is a view illustrating an example of a cutting tool.
Figure 4:
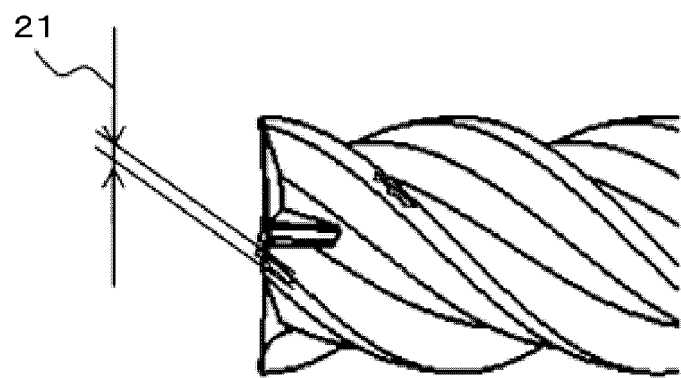
FIG. 4 is a view illustrating an example of tool wear.

FIG. 3 illustrates an example of the end mill. When performing machining with the cutting tool 3 that is the end mill, tool wear progresses at a cutting edge 20 that is a cutting edge portion. An enlarged view at this time is illustrated in FIG. 4. In the cutting edge 20, for example, tool wear 21 is observed on a flank. At this time, it is difficult to estimate an accurate amount through visual observation, and the accurate amount of wear is typically measured by using a microscope.

Figure 5:
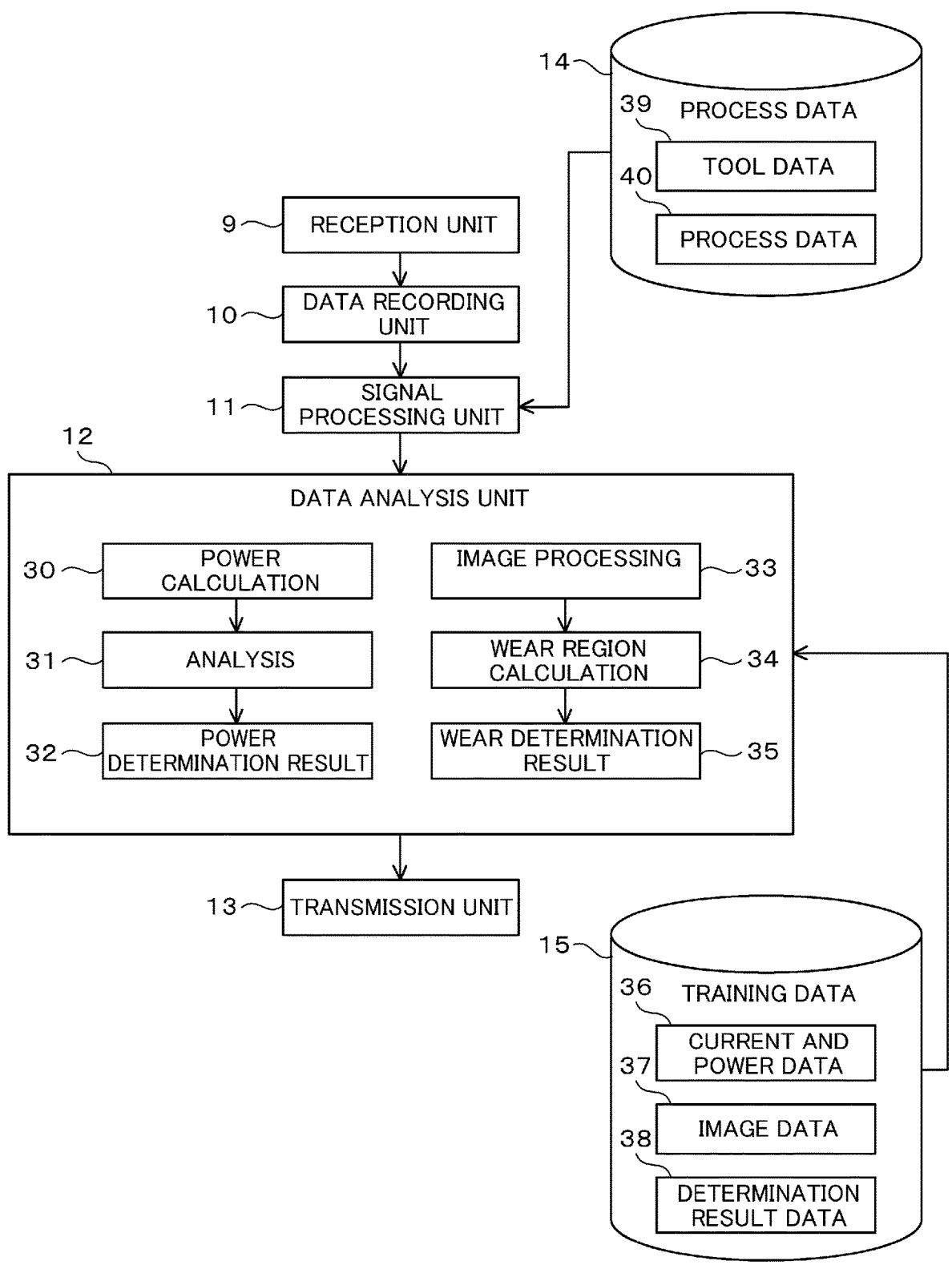
FIG. 5 is a view illustrating an example of a data analysis unit and related parts of the tool wear monitoring device of Example 1.

FIG. 5 illustrates an example of a data analysis unit and related parts of the tool wear monitoring device 2. In the signal processing unit 11, for example, tool data 39 and process data 40 are received from the process data 14. The reason for this is because appropriate signal processing is different depending on a tool and a process. For example, in a case of a process in which a specific vibration band such as chattering vibration becomes a problem, signal processing associated with the process by the signal processing unit 11, for example, FFT processing is effective. In addition, even in a case of a tool and a process in which a load is small and a variation is small in correspondence with the load, since an influence of an outlier or an influence of a high frequency becomes large, signal processing as in a filter that assists the outlier and a lowpass filter that eliminates the high frequency becomes important.

Data obtained by extracting only a portion necessary for determination in signal processing is input to the data analysis unit 12. In the data analysis unit 12, for example, current and voltage values are converted into power values in power calculation 30. In addition, a variation in a load during machining is read out from a variation in power in analysis 31. Next, an analysis result is output with a power determination result 32. Since the variation in power is almost correlated with the variation in load, for example, when power rapidly increases and decreases immediately after the increase, it is presumed that a tool is broken. In correspondence with the determination result, tool replacement due to tool breakage is fed back through the transmission unit 13, a machining stoppage signal is transmitted to a machining device, a process designer is notified of reexamination on machining conditions, a product designer is suggested to reexamine tolerance conditions of the part. Note that, a variation in load during machining may be estimated from a variation in current or voltage.

In a case of an image captured by the microscope camera 8, the amount of tool wear is analyzed through image processing 33 and wear region calculation 34. The analysis result is determined with wear determination result 35. Similarly, the following utilization methods are exemplified. In a case where tool wear exceeds a threshold value, a process designer is required to correct machining conditions, or information on a deterioration of finished surface accuracy due to an increase in surface roughness is transmitted to a person in charge of assembly, and advice is transmitted to an assembly worker. In addition, in a case of frequently exceeding the threshold value, a product designer may be notified of reexamination on tolerance setting as the utilization methods. To execute the methods, the training data 15 is necessary, and examples thereof include current and power data 36, image data 37, determination result data 38 representing a determination result at that time accumulated up to now.

Figure 6:
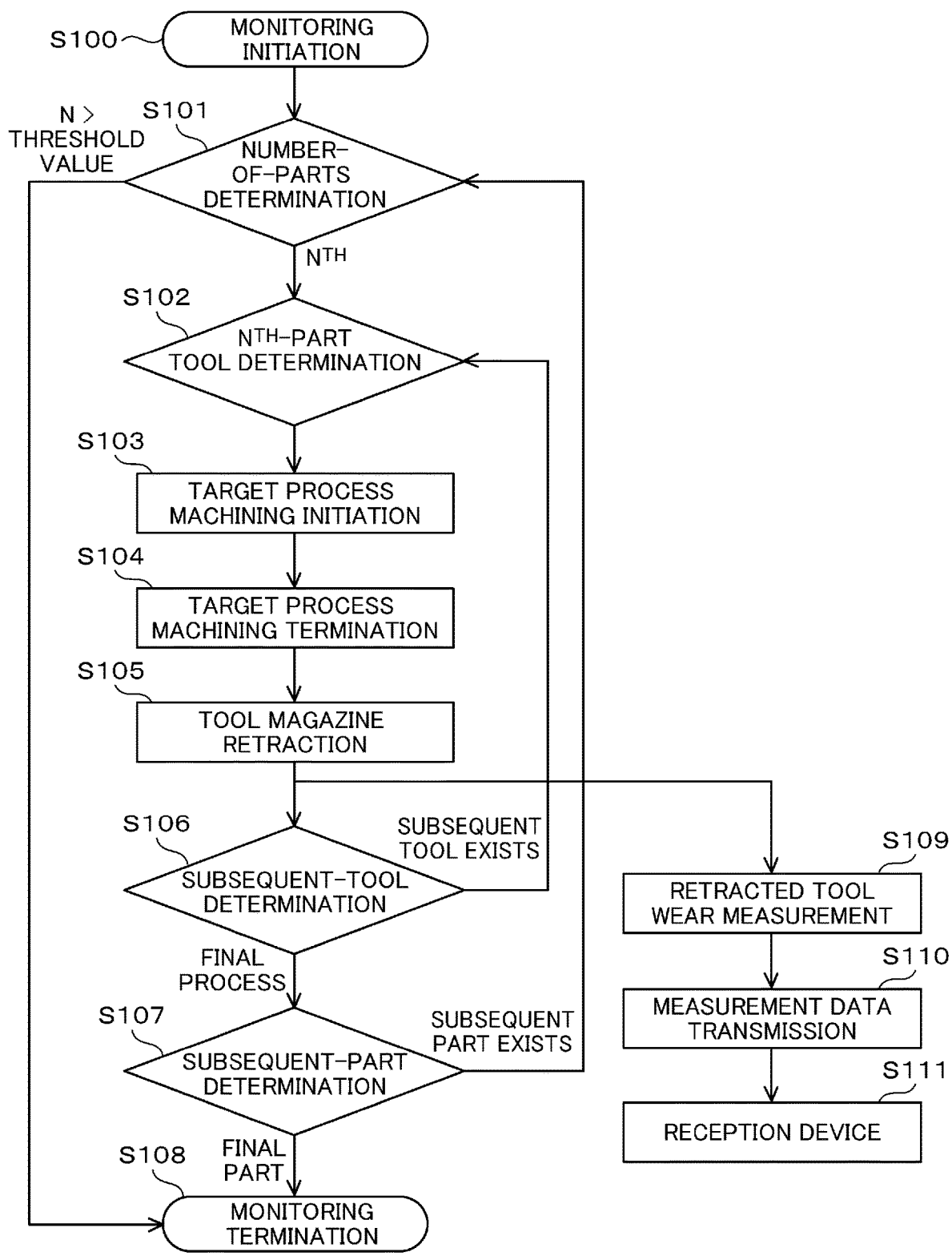
FIG. 6 is a view illustrating an operation flow of a tool wear monitoring system.

FIG. 6 illustrates an example of an operation flow of the tool wear monitoring system. First, the flow starts at monitoring initiation S100. Next, in the-number-of-parts determination S101, the number of parts is determined. At this time, in a case where the number (for example, N) is greater than a threshold value, monitoring is terminated in S108. In a case where the number is equal to or less than the threshold value, in $N^{th}$-part tool determination S102, it is determined which tool is to be used to determine a process. Next, a process of a target to be machined by the selected tool is initiated at target process machining initiation S103. Next, machining with the tool is terminated in target process machining termination S104. The tool that has been used is replaced by an automatic tool changer (ATC) and is retracted to the tool magazine in tool magazine retraction S105. Tool wear of the tool that has been retracted into the tool magazine is measured in retracted tool wear measurement S109. Measured data is transmitted to the reception unit 9 in measurement data transmission S110. Note that, when a first tool is retracted from the equipment in tool magazine retraction S105, the subsequent tool is continuously inserted. A tool and a process are grasped in subsequent-tool determination S106. In addition, machining is initiated through $N^{th}$-part tool determination S102. When all tools are finished, the loop is exited, and the process proceeds to subsequent-part determination S107. In a case where the subsequent part exists, the process returns to the-number-of-part determination S101, and machining is restarted. In a case where the subsequent part does not exist and the process is terminated, the process proceeds to monitoring termination S108 and the system is terminated.

FIG. 7 illustrates an example of a configuration diagram when image is captured with a microscope camera. This example is an example in a state in which the cutting tool 3 is fixed to a main shaft in the equipment instead of the tool magazine. When machining with a target cutting tool is terminated, the cutting tool 3 is moved to a location where the microscope camera 8 is fixed. The microscope camera 8 is fixed with a jig 61 so as not to be moved. When a tool cutting edge approaches the microscope camera 8 and stops, one rotation is made at the site. A plurality of images are captured during the one rotation. Note that, the cutting tool 3 may be fixed, and microscope camera 8 may be rotated around the cutting tool 3 to capture a plurality of images.

An imaging method is illustrated in FIG. 8. An appearance of the cutting edge is different depending on a rotation angle. According to this, an appearance of tool wear also varies. Therefore, for example, a plurality of images are captured with respect to the tool during rotation, images in which the cutting edge slightly deviates can be acquired. When performing this process for one rotation, wear images 62, 63, and 64 corresponding to the number of shots can be acquired for all blades. Wear regions of all captured images are calculated, and an image having the maximum wear area in one blade is selected. In a case of four-blade tool, four images having the maximum area are acquired for respective blades.

Unprocessed image data in FIG. 8 includes the background and a portion other than an abraded portion, and thus it is difficult to determine only the abraded portion. FIG. 9 illustrates an example of image processing. In the abraded portion, tool coating at the portion may be peeled off, an inner metal may be exposed, and the braded portion may glow white. Accordingly, when processing a white portion and the other portions through binarization processing or the like, it is possible to select only the abraded portion. As illustrated in post-processing wear extracted portions 70, 71, and 72, only a worn area at each rotation angle can be extracted. According to this, an image in which a worn area is the maximum can be selected.

Figure 10:
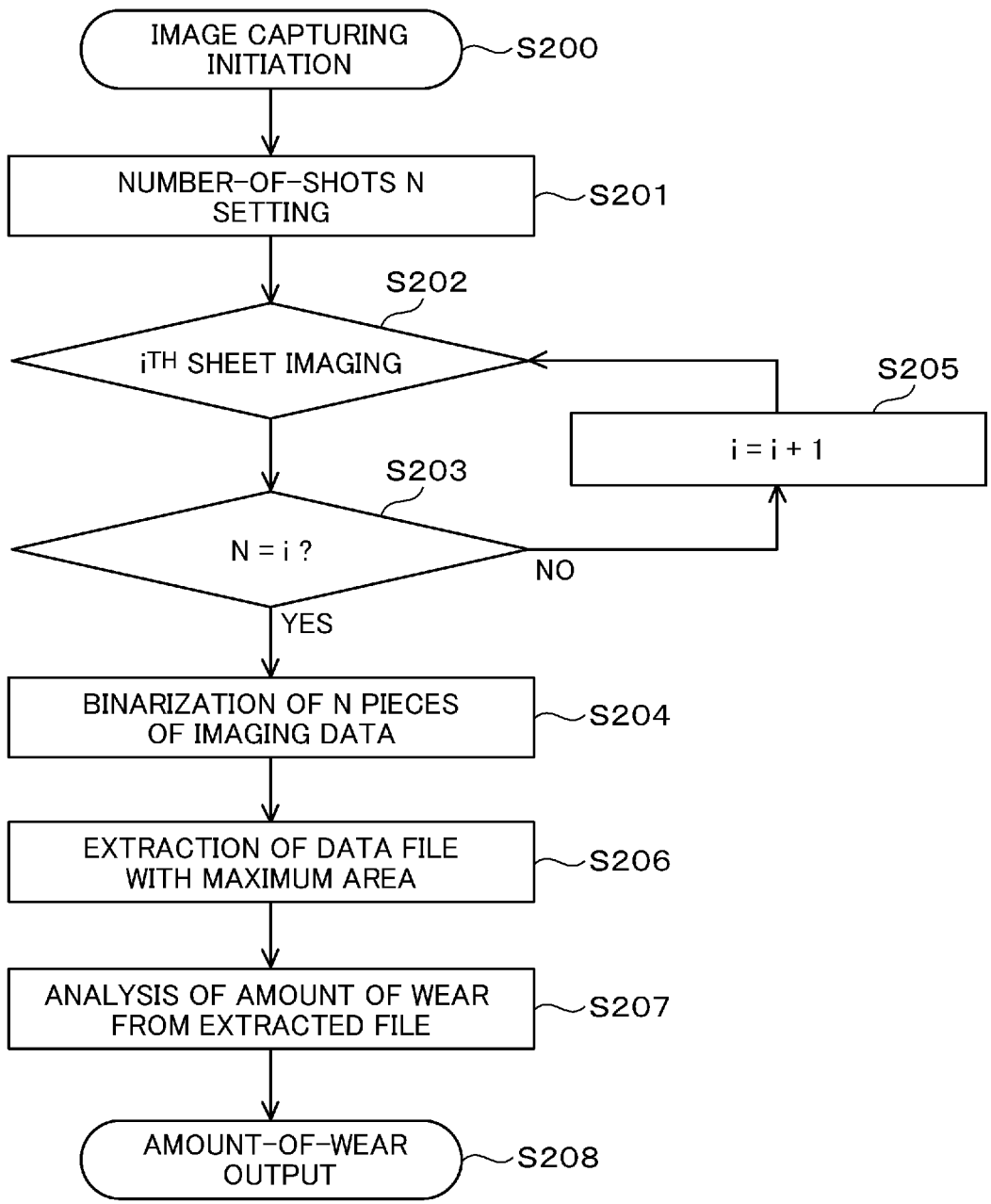
FIG. 10 is a view illustrating a flow of outputting the amount of wear from image capturing in Example 1.
Figure 11:
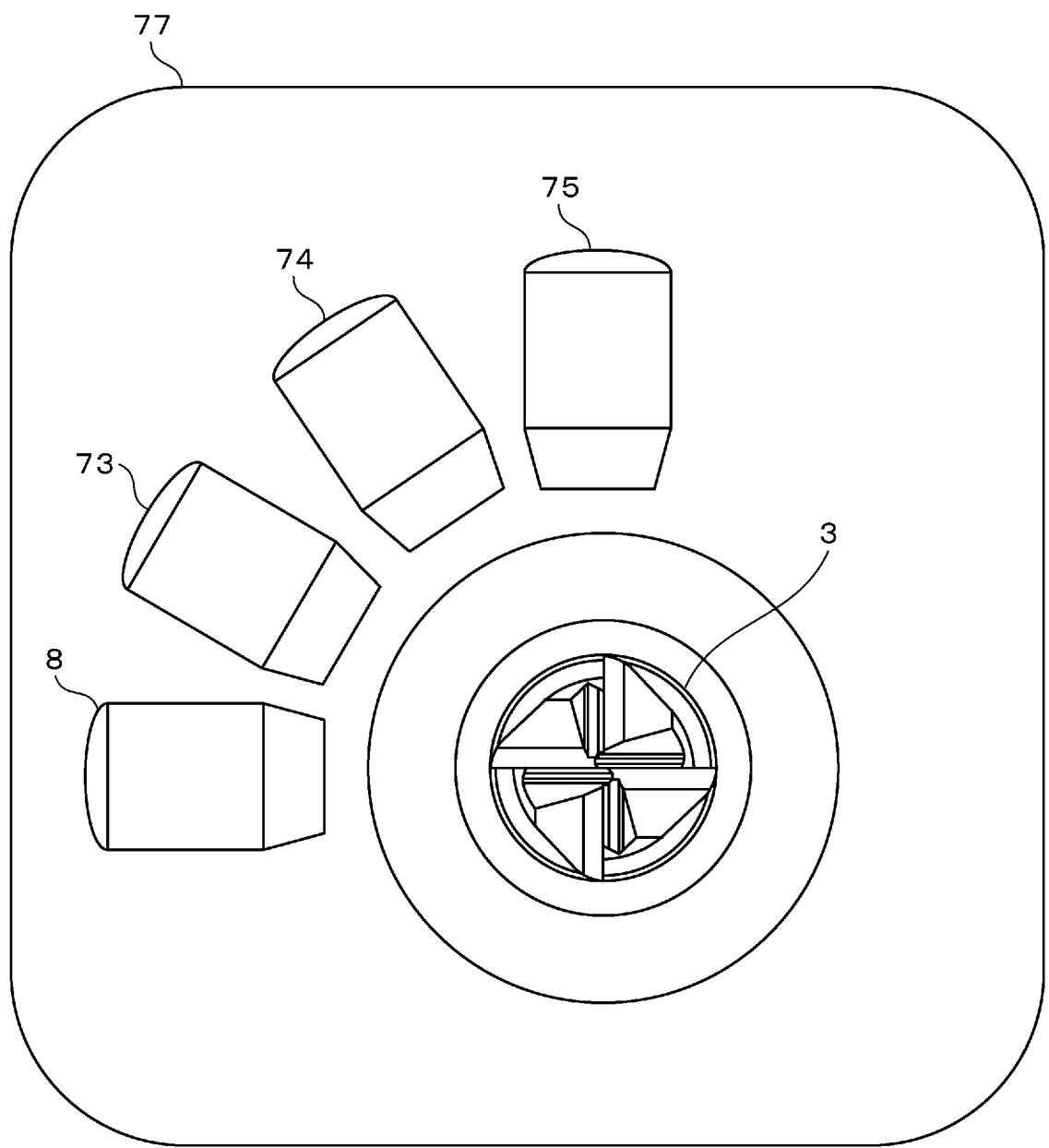
FIG. 11 is a view illustrating a configuration example of a tool wear monitoring system using a plurality of microscope cameras in Example 2.

FIG. 10 illustrates a series of flow of outputting the amount of wear from image capturing for the cutting edge 20 of the cutting tool. First, the flow initiated in image capturing initiation S200. Next, the necessary number of sheets is set in the-number-of-shots N setting S201. In a case of FIG. 7, a plurality of images of the cutting edge are captured during one rotation of the tool. However, for example, in a case of capturing an image by rotating the main shaft by one degree, "N=360" is input. In a case of FIG. 11 to be described later in Example 2, for example, when four cameras are provided, "N=4" is input to capture an image four times. Next, in $i^{th}$ sheet imaging S202, an image is captured with a camera. Next, in "N=i?" S203 that is the subsequent step, the current number of shots is confirmed. When reaching $N^{th}$ sheet, in binarization of N pieces of imaging data S204, for example, binarization of all captured image files is performed. In a case where it does not reach $N^{th}$ sheet yet, the process proceeds to "i=i+1" step S205. Here, in the case of FIG. 7, the tool is rotated by a designated angle. In the case of FIG. 11, the process proceeds to imaging preparation in an adjacent camera. The process proceeds to step S202, and the subsequent imaging is performed. When the binarization processing for all image files is completed, in step S206, a data file with the maximum area is extracted among the image files. Then, amount-of-wear analysis is performed from the extracted file in step S207, and finally, amount-of-wear data is output in amount-of-wear output S208.

According to this example, a plurality of images of the cutting edge of the cutting tool are captured with the microscope camera while changing an angle, the captured images are binarized, a data file with the maximum area is extracted among the images, and the amount of wear is analyzed to appropriately obtain the amount of wear of a side surface and the like of the cutting tool. In addition, a current value and a voltage value of a spindle motor are measured with the current and voltage sensor, power is calculated, and a load during machining is estimated from a variation in the current, the voltage, or the power to detect breakage or the like in the cutting tool.

Example 2

FIG. 11 illustrates a tool wear monitoring system of Example 2. In Example 2, wear of the cutting tool 3 that is retracted to a tool magazine 77 is measured by using a plurality of microscope cameras.

The tool in the tool magazine cannot be rotated. Accordingly, for example, when cameras are provided around the cutting tool 3 in a circumferential shape as in a plurality of microscope cameras 8, 73, 74, and 75, images indicating tool wear measured from appropriate angles can be acquired.

The tool magazine 77 is spatially restricted. Accordingly, when using a plurality of small microscope cameras, it is considered that measurement accuracy will be improved.

According to this example, the amount of wear of the side surface and the like of the cutting tool that is retracted to the tool magazine can be appropriately obtained.

Example 3

FIG. 12 illustrates a GUI of a tool wear monitoring system of Example 3. In Example 3, evaluation and analysis results for tool wear are shown on a screen of a GUI 19.

As illustrated in the drawing, a tool number 81 for tool identification, a threshold value 82 that is set to perform necessary control, and tool cutting edge photographs 84, 85, 86, and 87 representing acquired tool wear images are displayed. In addition, each plot 88 of the amount of tool wear (area) for each number of machined pieces, and a graph 83 of a tool wear curve representing a relationship between the number of machined pieces and the amount of tool wear (area) are displayed. A right end plot exceeds the threshold value, and replacement of the cutting tool is necessary.

According to this example, since the plot of the amount of tool wear (area) for each number of machined pieces is displayed on the screen of the GUI, it can be recognized that replacement of the cutting tool is necessary when exceeding a threshold value. In addition, since the graph of the tool wear curve is displayed, a tool replacement time can be predicted.

Example 4

Figure 13:
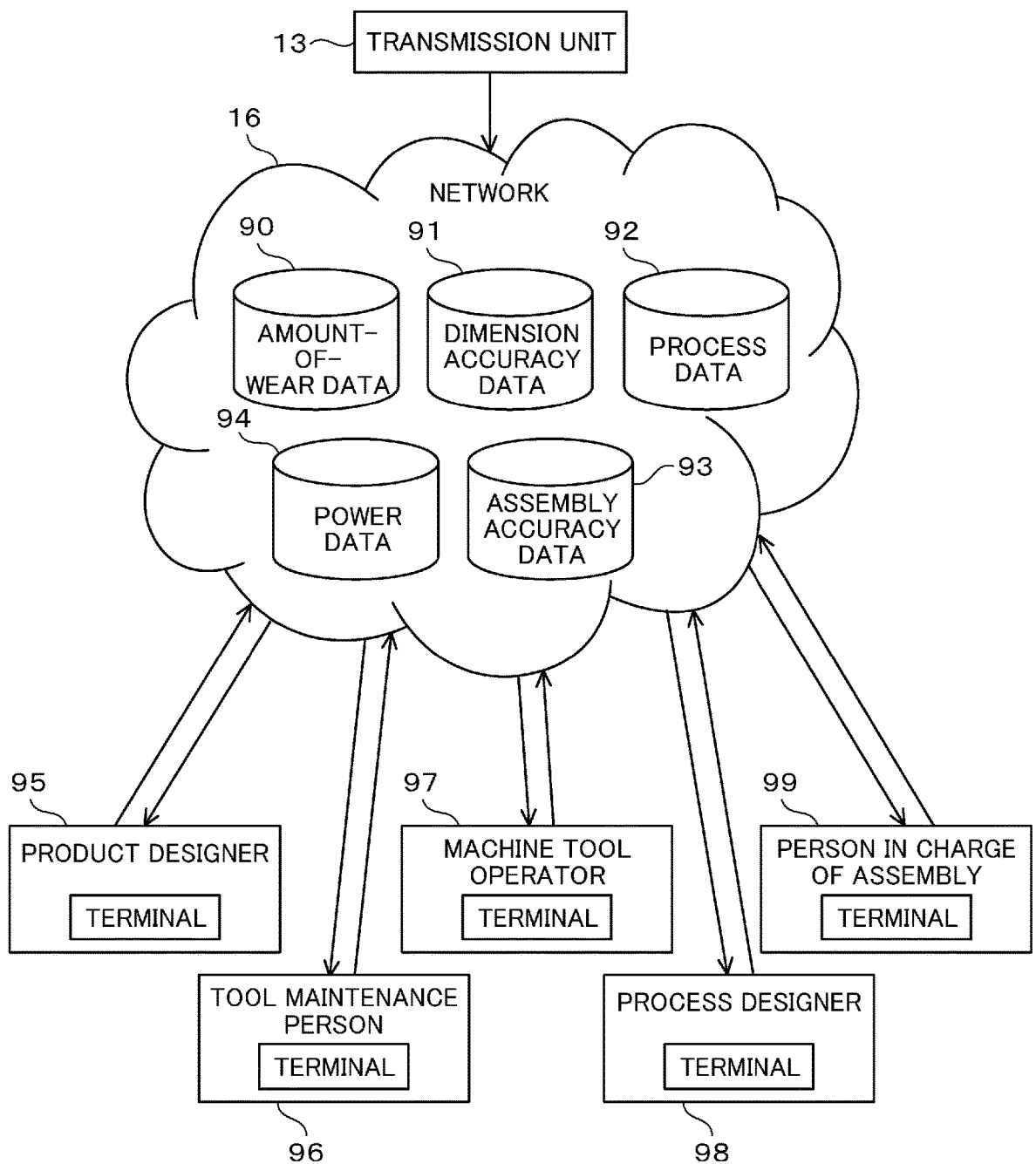
FIG. 13 is a view illustrating an example of a network of a tool wear monitoring system of Example 4.

FIG. 13 illustrates an example of a tool wear monitoring system of Example 4. In Example 4, the tool wear monitoring system forms a network.

To solution-develop the tool wear monitoring system, a utilization method through a network is important. Data including an analysis result transmitted from the transmission unit 13 is transmitted to a network 16. Various pieces of data are accumulated in the network 16. Examples of the data include amount-of-wear data 90 imaged by the microscope camera 8, dimension accuracy data 91 associated with the amount of wear, process data 92, power data 94 measured by the current and voltage sensor, assembly accuracy data 93, and the like. The network 16 may be a cloud or an in-office server. The network 16 may be a type that can be shared by a plurality of parties.

Here, it is assumed that examples of the parties include a product designer 95, a tool maintenance person 96, a machine tool operator 97, a process designer 98, and a person in charge of assembly 99. Respective parties have a terminal, and an instruction or advice from the network is transmitted. In a case where tool wear progresses immediately and it is difficult to obtain desired surface roughness, the gist is transmitted to the product designer 95 from the network 16, and the product designer 95 transmits a correction instruction or a tolerance correction value to the network 16. When the amount of tool wear reaches a threshold value, the tool maintenance person 96 receives a tool replacement timing from the network 16, and prepares a new tool. When the tool wear approaches the threshold value, or a rapid increase in power data or the like occurs, the machine tool operator 97 receives the gist from the network 16, and takes a measure by adjusting override or the like of the machine tool at hand. In addition, a request for machining condition correction is made to the process designer 98. The person in charge of assembly 99 receives information on a finished surface accuracy deterioration due to machined surface accuracy deterioration caused by tool wear or an increase in power, and transmits or receives advice.

According to this example, tool wear information measured by the tool wear monitoring device can be shared by a plurality of parties through the network, and it is possible to quickly make a measure for the tool wear.

Note that, the invention is not limited to the above-described examples, and various modification examples are included. For example, the above-described examples describe the invention in detail for easy understanding, and it is not limited to include all configurations. In addition, a part of configurations of an arbitrary example can be substituted with a configuration of another example, and a configuration of another example can be added to configurations of an arbitrary example. In addition, addition, deletion, and substitution of another configuration can be made with respect to a part of configuration of the respective examples.

What is claimed is:

1. A tool wear monitoring device configured to input a plurality of pieces of image data captured with a microscope camera while changing an angle, and to monitor tool wear of a tool, the device comprising:
   a data analysis unit configured to analyze the plurality of pieces of image data,
   wherein the data analysis unit,
   binarizes the plurality of pieces of image data captured while changing the angle,
   extracts data in which a worn region has a maximum area among the plurality of pieces of image data,
   analyzes an amount of the tool wear of the tool from the extracted data with the maximum area, and
   controls movement and operation of the tool based on the amount of the tool wear.

2. The tool wear monitoring device according to claim 1, further comprising:
   a reception unit configured to receive measurement data transmitted from the microscope camera and a current and voltage sensor;
   a data recording unit configured to record the received data;
   a signal processing unit configured to perform signal processing for the data; and
   a transmission unit configured to transmit an analysis result obtained by the data analysis unit to a network.

3. The tool wear monitoring device according to claim 2, wherein the data analysis unit,
   further estimates a load during machining from a variation of a current, a voltage, or power based on the measurement data transmitted from the current and voltage sensor, and
   outputs an analysis result.

4. The tool wear monitoring device according to claim 1, further comprising:
   a display device configured to display a monitoring situation,
   wherein the display device displays a tool number to be displayed, a threshold value, and a tool wear curve representing a relationship between the number of machined pieces and the amount of tool wear.

5. A tool wear monitoring system configured to monitor tool wear of a tool, the system comprising:
   a microscope camera configured to capture a plurality of images of a tool cutting edge while changing an angle;
   a tool wear monitoring device configured to analyze measurement data; and a network configured to accumulate an output of the tool wear monitoring device, wherein a data analysis unit of the tool wear monitoring device, binarizes a plurality of pieces of image data captured while changing an angle, extracts data in which a worn region has a maximum area among the plurality of pieces of image data, analyzes an amount of the tool wear from the extracted data with the maximum area, and controls movement and operation of the tool based on the amount of the tool wear.

6. The tool wear monitoring system according to claim 5, further comprising:

a sensor configured to measure a current and a voltage of a motor of a machine tool, wherein the data analysis unit of the tool wear monitoring device, further estimates a load during machining from a variation of a current, a voltage, or power based on the measurement data transmitted from the current and voltage sensor, and outputs an analysis result.

7. The tool wear monitoring system according to claim 5, wherein the microscope camera is fixed, and captures the plurality of images of the tool cutting edge while changing an angle in accordance with rotation of the cutting tool.

8. The tool wear monitoring system according to claim 5, wherein the cutting tool is fixed, and the plurality of images of the tool cutting edge are captured with a plurality of the microscope cameras arranged at the periphery of the cutting tool while changing an angle.

9. The tool wear monitoring system according to claim 5, wherein the tool wear monitoring device includes, a reception unit configured to receive measurement data transmitted from the microscope camera and a current and voltage sensor, a data recording unit configured to record the received data, a signal processing unit configured to perform signal processing for the data, the data analysis unit configured to analyze the signal-processed data, and a transmission unit configured to transmit an analysis result to a network.

10. The tool wear monitoring system according to claim 5, further comprising:

a display device configured to display a monitoring situation, wherein the display device displays a tool number to be displayed, a threshold value, and a tool wear curve representing a relationship between the number of machined pieces and the amount of wear.

11. The tool wear monitoring system according to claim 5, wherein the network includes at least one among amount-of-wear data, dimension accuracy data, process data, power data, and assembly accuracy data.

12. A non-transitory computer-readable medium storing a program configured to cause a computer to function as a tool wear monitoring device configured to input a plurality of pieces of image data captured with a microscope camera while changing an angle, and to monitor tool wear of a tool, wherein the program causes the computer to function as a data analysis unit configured to binarize the plurality of pieces of image data captured while changing an angle, extract data in which a worn region has a maximum area among the plurality of pieces of image data, analyze an amount of the tool wear from the extracted data with the maximum area, analyze image data, and control movement and operation of the tool based on the amount of the tool wear.

13. The non-transitory computer-readable medium according to claim 12, the program further causing the computer to function as:

a reception unit configured to receive measurement data transmitted from the microscope camera and a current and voltage sensor;

a data recording unit configured to record the received data;

a signal processing unit configured to perform signal processing for the data; and a transmission unit configured to transmit an analysis result obtained by the data analysis unit to a network.

14. The non-transitory computer-readable medium according to claim 12, wherein the data analysis unit is further caused to, estimate a load during machining from a variation of a current, a voltage, or power based on measurement data transmitted from a current and voltage sensor, and output an analysis result.

* * * * *